United States Patent

Agata et al.

[11] Patent Number: 5,965,063
[45] Date of Patent: Oct. 12, 1999

[54] CHARGE TRANSPORTING MATERIAL AND METHOD OF PREPARING CHARGE TRANSPORTING PARTICULATES USED THEREIN

[75] Inventors: Takeshi Agata; Masakazu Iijima; Wataru Yamada; Katsumi Nukada; Yasuhiro Yamaguchi; Taketoshi Hoshizaki, all of Minami-Ashigara, Japan

[73] Assignee: Fuji Xerox Co., Ltd., Tokyo, Japan

[21] Appl. No.: 08/971,722

[22] Filed: Nov. 17, 1997

[30] Foreign Application Priority Data

Nov. 26, 1996 [JP] Japan .................................. 8-315235

[51] Int. Cl.$^6$ .............................. H01B 1/12; H01B 1/20; B32B 5/00
[52] U.S. Cl. ............................. 252/500; 524/81; 428/407
[58] Field of Search .............................. 252/500; 524/81; 428/403, 405, 407

[56] References Cited

U.S. PATENT DOCUMENTS

| | | | |
|---|---|---|---|
| 4,983,482 | 1/1991 | Ong et al. | 430/59 |
| 5,034,296 | 7/1991 | Ong et al. | 430/59 |
| 5,235,104 | 8/1993 | Yamada et al. | 524/251 |
| 5,567,355 | 10/1996 | Wessling et al. | 252/500 |
| 5,720,903 | 2/1998 | Wessling et al. | 252/500 |
| 5,736,284 | 4/1998 | Kobayashi et al. | 430/79 |

FOREIGN PATENT DOCUMENTS

| | | |
|---|---|---|
| 64-3671 | 1/1989 | Japan . |
| 2-203352 | 8/1990 | Japan . |
| 4-353861 | 12/1992 | Japan . |
| 6-83077 | 3/1994 | Japan . |

OTHER PUBLICATIONS

Murti, D.K. et al. "Charge Transport Polymers Based on Triphenylamine and Tetraphenylbenzidine Moieties." Proceedings of the Sixth International Congress on Advances in Non-Impact Printing Technologies, Oct. 1990, pp. 306–311.

*Primary Examiner*—Mark Kopec
*Attorney, Agent, or Firm*—Oliff & Berridge, PLC

[57] ABSTRACT

Disclosed are a charge transporting material useful as a material for organic electronic devices such as an electrophotographic photoreceptor, an organic EL device, and an organic solar cell and a process for the preparation of charge transporting fine particles. The charge transporting material comprises charge transporting fine particles formed with a charge transporting organic compound as an essential component, said charge transporting organic compound being selected from high molecular compounds and low molecular compounds, each having a positive hole transporting property or electron transporting property. The fine particles are granulated by emulsion dispersion, with a preferred average particle size of 0.01 to 50 μm, and particle size distribution of 1.0 to 2.0 in terms of the square root of the ratio of 90% average particle size to 10% average particle size of the total volume or total number of the fine particles. At least one portion of the surface of the fine particles may be covered with a second compound which may react with said charge transporting compound.

16 Claims, 1 Drawing Sheet

CHARGE TRANSPORTING MATERIAL AND METHOD OF PREPARING CHARGE TRANSPORTING PARTICULATES USED THEREIN

BACKGROUND OF THE INVENTION

1. Field of the Invention

The present invention relates to a charge transporting material useful as organic electronic device materials such as an electrophotographic photoreceptor, an organic EL device, and an organic solar cell and a process for the preparation of charge transporting fine particles used for the material.

2. Description of the Related Art

A low-molecular dispersion type organic semiconductor in which a low-molecular charge transporting compound, such as a triarylamine or tetraarylbenzidine type compound, is dispersed in a resin, or an organic semiconductor containing a charge transporting resin typified by a polyvinyl carbazole derivative (PVK) is an important component of a charge transporting layer in an organic electronic device such as an electrophotographic photoreceptor, an electrophotographic photoconductive toner or an organic EL device. Various proposals have been made with a view to improve the charge transporting ability and physical and chemical durability thereof.

For example, charge transporting resins having as a pendant a charge transporting substituent such as hydrazone or triarylamine have been investigated from the viewpoints of the improvement in charge transporting ability and mechanical durability. Among them, a charge transporting resin having a tetraarylbenzidine skeleton is known to have a high mobility and therefore have high utility as reported in "The Sixth International Congress on Advances in Non-impact Printing Technologies, p.306(1990)".

A polycarbonate or polyester of an arylamine having a specific fluorene skeleton is disclosed in U.S. Pat. No. 5,034,296, and a polyurethane is disclosed in U.S. Pat. No. 4,983,482.

As an example of an organic electronic device using such a charge transporting compound, a heterogeneous electron transporting layer comprising charge transporting molecular crystallites and an insulating resin or a heterogeneous electron transporting layer comprising a block copolymer composed of an insulating block and a charge transporting block, in order to form a contorted charge transporting path in a charge transporting layer as a photoreceptor constitution aimed at obtaining a high image quality for digital image formation in the recent electrophotographic field is proposed in Japanese Patent Application Laid-Open (JP-A) No. 6-83077. However, properties such as charge transporting ability and residual potential of some charge transporting molecules are not always satisfactory in practical use. It has also been proposed to provide a heterogeneous charge transporting layer obtained by dispersing, in an insulating resin, a charge mobile organic pigment such as phthalocyanine or a charge mobile inorganic pigment such as selenium. That proposal was, however, not always satisfactory in practice due to a deviation of charge transferring properties attributable to the heterogeneous particle shape or limitation of the freedom of the device designing in the selection of the charge generating layer, since the pigment has an optical sensitivity in its specific wavelengths.

In order to reduce residual potential or to maintain image quality over a long period, it has been proposed to provide a layer containing a charge transporting compound such as an organic electron transporting pigment (Japanese Patent Application Laid-Open (JP-A) No. 64-3671), a fluorene derivative (Japanese Patent Application Laid-Open (JP-A) No. 2-203352) and a diphenoquinone derivative (Japanese Patent Application Laid-Open (JP-A) 4-353861), each having an electron transporting property, as an undercoat layer for an electrophotographic photoreceptor. For practical use, compounds having even better properties in charge transporting and durability are being sought. Ideally, it is preferred from the viewpoint of heightening the freedom of device designing, to form an undercoat layer as a charge mobility layer to permit the structural control of charge mobility.

On the other hand, application of a low-molecular charge transporting material to an organic EL device has drawn attention. It is however accompanied by the problem that since the low-molecular compound is melted by the joule heat generated when it is applied to an organic EL device, a stable device with a long life is not easily available.

SUMMARY OF THE INVENTION

The present invention has been completed in order to overcome the above-described problems of the charge transporting layer and to aim at improving the charge transporting properties and durability of various organic devices including an electrophotographic photoreceptor. An object of the present invention is to provide charge transporting fine particles which can impart the charge transporting layer with excellent charge mobility and durability.

An object of the present invention is to eliminate the deviation in the charge transferring properties in a layer resulting from the particle shape of the charge transferring layer which structurally controls the charge transporting properties; and to provide a charge transporting material composed of spherical charge transporting fine particles, which has excellent charge transporting properties and compared with conventional charge transporting pigments, permits free selection of other constituent layers from the viewpoint of device design. Another object of the present invention is to provide charge transporting fine particles which have excellent resin dispersion, solvent resistance and thermal stability properties, can form a dispersion layer having high durability and can constitute a charge transporting material useful as a component of various organic electronic devices such as electrophotographic photoreceptors, organic EL devices and organic solar cells; and a process for the preparation thereof.

The present inventors have carried out an extensive investigation, and as a result, it has been found that a charge transporting material composed of charge transporting fine particles having an average particle size of about 0.01 to 50 μm and exhibiting a specific particle size distribution, with the fine particles obtained by granulating an organic compound having charge transporting properties in a liquid medium, or charge transporting fine particles further having, on the surface of the fine particles, a covering layer composed of a second component which may react with the charge transporting organic compound, is particularly excellent in improving charge transporting characteristics and improving durability in the above-described charge transporting compound, and is suited as a material for a heterogeneous charge transporting layer or an undercoating layer of an electrophotographic photoreceptor, leading to the completion of the invention.

In the present invention, there is thus provided a charge transporting material comprising charge transporting fine particles being formed with a charge transporting organic compound as an essential component.

The charge transporting organic compound is at least one compound selected from high-molecular compounds and low-molecular compounds, each having a positive hole transporting property or an electron transporting property. Among them, high-molecular compounds represented by the following general formulas (1) to (6) are preferred.

General formula (1)
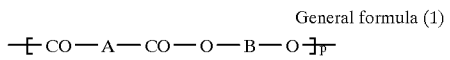

General formula (2)
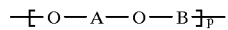

General formula (3)

General formula (4)
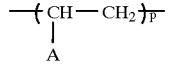

General formula (5)
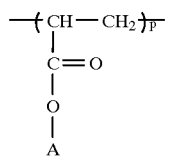

General formula (6)
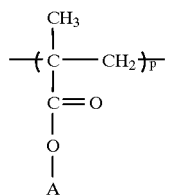

wherein A and B each independently represents a monovalent or divalent aliphatic hydrocarbon group or aromatic hydrocarbon group which may be substituted and at least one of A and B represents any one of the following general formulas (7) to (15) and p represents an integer of 5 to 5000.

General formula (7)
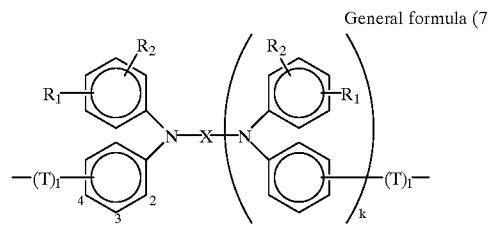

General formula (8)
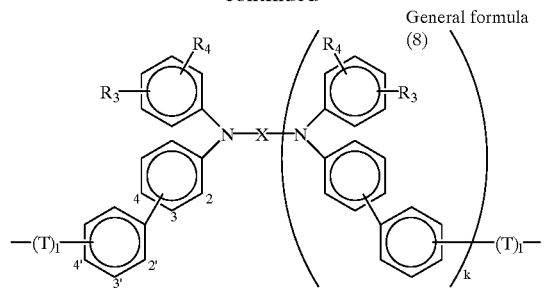

Here, $R_1$ to $R_4$ described in the formulas (7) and (8) each independently represents a hydrogen atom, an alkyl group, an alkoxy group, a substituted amino group, a halogen atom, or a substituted or unsubstituted aryl group; X represents a substituted or unsubstituted divalent aryl group; k and l each independently represents an integer selected from 0 or 1; and T represents a divalent $C_{1-10}$ alkyl group, allyl group, alkylcarbonyl group, allylcarbonyl group, alkylamino group, allylamino group, hydroxyalkyl group or hydroxyallyl group which may be branched.

General formula (9)

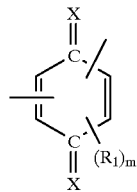

X: an oxygen atom or

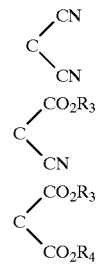

($R_2$, $R_3$: an alkyl or aryl group)

$R_1$: an alkyl group, an aryl group, a halogen atom, a nitro group, an acyl group or a cyano group.

m: an integer of 0 to 2

General formula (10)

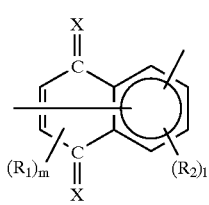

X: an oxygen atom or

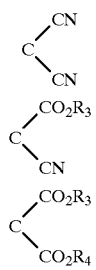

(R₃, R₄: an alkyl or aryl group)

R₁, R₂: an alkyl group, an aryl group, a halogen atom, a nitro group, an acyl group or a cyano group.

M, l: an integer of 0 to 2

General formula (11)

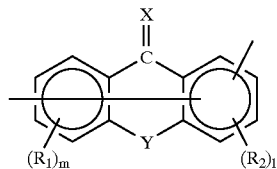

X: an oxygen atom or

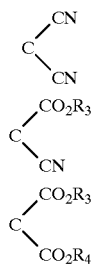

(R₂, R₃: an alkyl or aryl group)

Y: C=X, O, S, SO₂, NR₅ (R₅: a hydrogen atom, an alkyl group, an aryl group or an acyl group)

R₁, R₂: an alkyl group, an aryl group, a halogen atom, a nitro group, an acyl group or a cyano group.

M, l: an integer of 0 to 2

General formula (12)

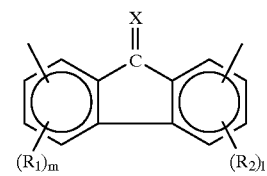

X: an oxygen atom or

-continued

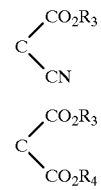

(R₃, R₄: an alkyl or aryl group)

(R₁, R₂: an alkyl group, an aryl group, a halogen atom, a nitro group, an acyl group or a cyano group.

M, l: an integer of 0 to 2

General formula (13)

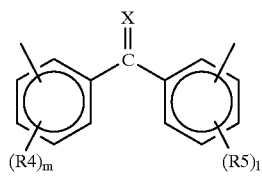

X: an oxygen atom or

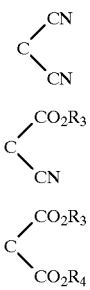

(R₃, R₄: an alkyl or aryl group)

R₁, R₂: an alkyl group, an aryl group, a halogen atom, a nitro group, an acyl group or a cyano group.

M, l: an integer of 0 to 2

General formula (14)

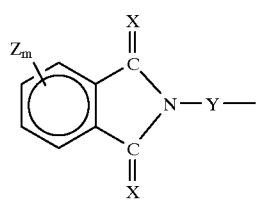

X: an oxygen atom or

Y: —COO—(CH$_2$)$_n$ or

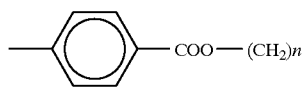

(n: an integer of 1 to 6).

Z: an alkyl group, a halogen atom, a nitro group, an acyl group or a cyano group.

m: an integer of 0 to 2

General formula (15)

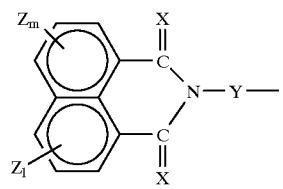

X: an oxygen atom or

Y: —COO—(CH$_2$)$_n$ or

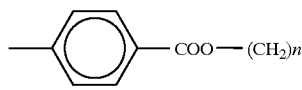

(n: an integer of 1 to 6).

Z: an alkyl group, a halogen atom, a nitro group, an acyl group or a cyano group.

M, l: an integer of 0 to 2

It is preferred that the charge transporting fine particles constituting the charge transporting material of the present invention have an average particle size of 0.01 to 50 µm, and exhibit particle size distribution ranging from 1.0 to 2.0, as calculated from the square root of the ratio of 90% average particle size to 10% average particle size of the total volume of the fine particles or the square root of the ratio of 90% average particle size to 10% average particle size of the total number of the fine particles (the above square root will hereinafter be called "GSD value" as appropriate).

In addition, it is desired from the viewpoint of the improvement in solvent resistance and durability, that at least a portion of the surface of the charge transporting fine particles according to the present invention, is covered with a second compound which may react with the charge transporting compound. Here, the second compound which may react with the charge transporting compound is preferably selected from the group consisting of silyl isocyanate compounds, multivalent isocyanate compound, silane coupling agents and titanate coupling agents.

A process for the preparation of charge transporting fine particles according to the present invention, comprises dissolving a charge transporting compound in a first medium which permits dissolution or dispersion of the compound, dispersing or dissolving the resulting solution or dispersion in a second medium different from the first medium and then removing the first medium and/or second medium, thereby carrying out granulation.

A process for the preparation of fine particles according to the present invention having a covering layer, comprises dissolving or dispersing a charge transporting compound and a second compound which may react with said charge transporting compound in a first medium which can dissolve or disperse the compound therein, dissolving or dispersing the resulting solution or dispersion in a second medium different from the first medium, and then removing the first medium and/or second medium, thereby carrying out granulation.

Here, the second medium different from the first medium may contain a third compound which can react with the second compound which may react with the charge transporting compound. The third compound which can react with the second compound is preferably at least one compound selected from polyols and polyamines.

DESCRIPTION OF THE PREFERRED EMBODIMENTS

Figure 1A:
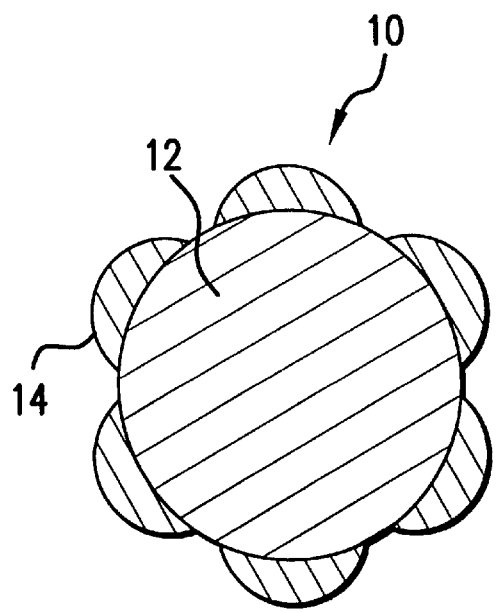
FIG. 1A illustrates charge transporting fine particles using a charge transporting compound as a covering component.

The charge transporting material of the present invention is characterized by comprising charge transporting fine particles. To attain a preferable charge transporting performance, it is necessary that the fine particles have a form close to a sphere, have a particle size within a certain range, and exhibit a particle size distribution of 1.0 to 2.0 in terms of GSD value.

Namely, the charge transporting fine particles preferably have an average particle size of 0.01 to 50 µm, and exhibit the square root (GSD value) of the ratio of 90% average particle size to 10% average particle size of the total volume of fine particles or total number of fine particles, within a range of from 1.0 to 2.0, which is an index indicating the particle size distribution.

Here, the average particle size of charge transporting fine particles can be confirmed in a publicly disclosed manner known such as by Coulter counter or laser diffraction meter. Based on the value obtained by this method, the GSD value indicating the particle size distribution can be calculated by the following method. Namely, the average particle size of 90% of the total volume of the fine particles and the average particle size of 10% thereof, or the average particle size of 90% of the total number of the fine particles and the average particle size of 10% thereof, were measured and from them, a GSD value is determined in accordance with the following equation:

$$GSD = \sqrt{\frac{d90v}{d10v}}$$

wherein:

d90n=average particle size of 90% of total volume d10n=average particle size of 10% of total volume $$GSD = \sqrt{\frac{d90n}{d10n}}$$

wherein
  d90n=average particle size of 90% of total number
  d10n=average particle size of 10% of total number The charge transporting fine particles of the present invention exhibiting the particle size and particle size distribution as described above, can be prepared preferably by a method which will be described below. Namely, the method comprises dissolving or dispersing a charge transporting compound in a first medium which can dissolve or disperse the compound, dispersing or dissolving this in a second medium different from the first medium, and then removing the first and/or second medium, thereby carrying out granulation. As a specific example, in cases where the compound having a charge transporting property is soluble in oil, the method include, dissolving or dispersing this compound in a specific organic solvent, thereby forming an oil phase, subjecting this to emulsion dispersion in an aqueous medium, thereby forming an oil-in-water emulsion, and then removing the organic solvent from the emulsion. In this manner, charge transporting fine particles can be obtained which have an average particle size of 0.01 to 10 μm, exhibit narrow particle size distribution and therefore are suited for the charge transporting material of the present invention.

As the organic compound having a charge transporting property, a compound having either a positive hole transporting property or an electron transporting property can be used. The fine particles obtained may be used after being washed and then filtered into fine particles alone or in the form of a dispersed solution after solvent substitution.

Examples of the positive hole or electron transporting high molecular compound used as the charge transporting high-molecular compound in the present invention include those represented by the following general formulas (1) to (6):

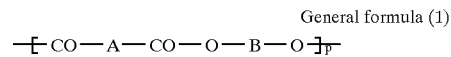
General formula (1)

General formula (2)

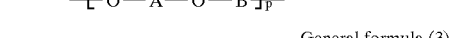
General formula (3)

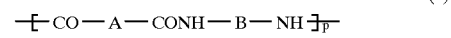
General formula (4)

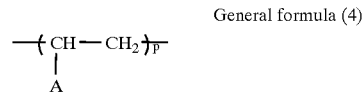
General formula (5)

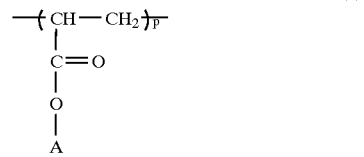
General formula (6)

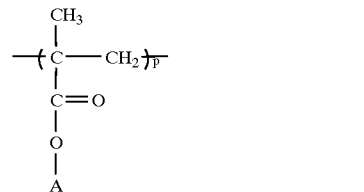

wherein A and B each independently represents a divalent aliphatic hydrocarbon group or aromatic hydrocarbon group which may be substituted, and at least one of A and B represents any one of the following general formulas (7) to (15); and p represents an integer of 5 to 5000.

General formula (7)

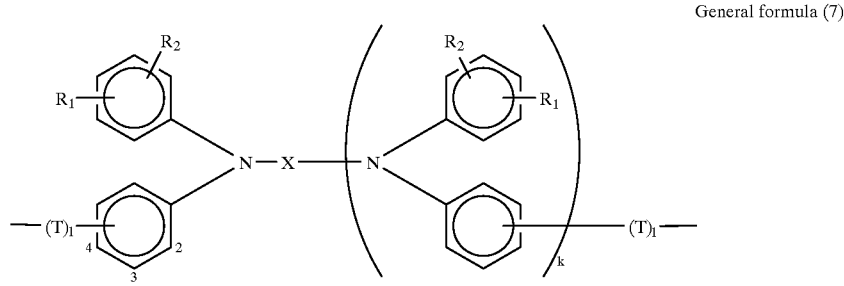

-continued

General formula (8)

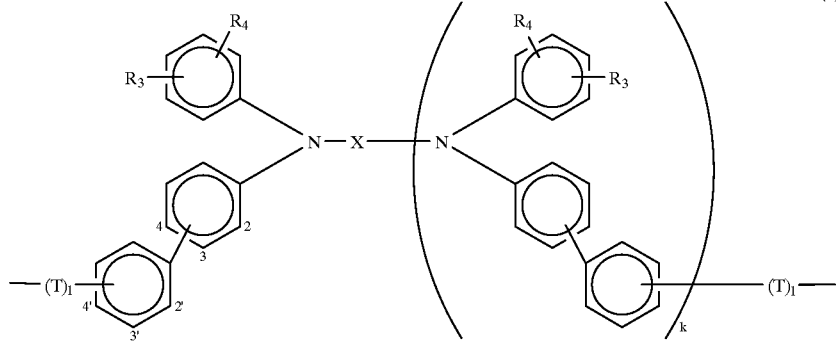

Here, $R_1$ to $R_4$ in the general formulas (7) and (8) each independently represents a hydrogen atom, an alkyl group, an alkoxy group, a substituted amino group, a halogen atom, or a substituted or unsubstituted aryl group; X represents a substituted or unsubstituted divalent aryl group; k and l each independently represents an integer selected from 0 or 1; and T represents a divalent $C_{1\text{-}10}$ alkyl group, allyl group, alkylcarbonyl group, allylcarbonyl group, alkylamino group, allylamino group, hydroxyalkyl group or hydroxyallyl group which may be branched.

In the general formulas (7) to (8), as the divalent hydrocarbon group or hetero-atom-containing hydrocarbon group which is represented by X and contains a substituted or unsubstituted aromatic ring, those selected from the following groups (1) to (7) can be given as examples. In addition, a phenyl group, substituted or unsubstituted aralkyl group and halogen atom can be given as preferable examples.

X:

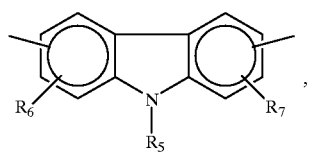 (1)

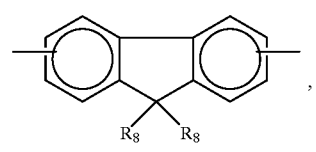 (2)

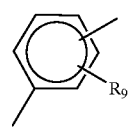 (3)

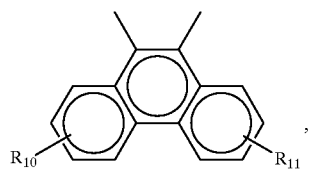 (4)

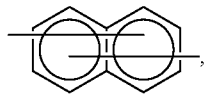 (5)

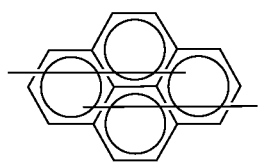 (6)

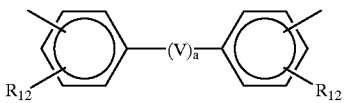 (7)

In the general formulas (1) to (7), a represents 0 or 1 and V represents a group selected from the following groups (8) to (17).

V:

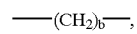 (8)

 (9)

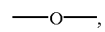 (10)

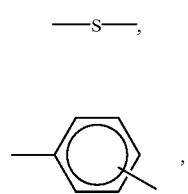 (11)

 (12)

 (13)

—C(CF$_3$)$_2$—, (14)

—Si(CH$_3$)$_2$—, (15)

—CH═CH—, (16)

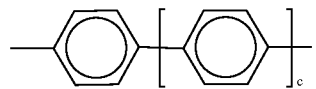 (17)

In the general formulas (8) to (17), b represents an integer of 1 to 10 and c represents an integer of 1 to 3.

The general formulas (9) to (15) are shown below.

General formula (9)

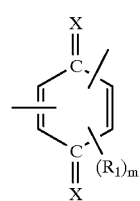

X: an oxygen atom or

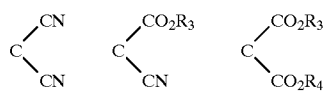

($R_2$, $R_3$: an alkyl or aryl group)

$R_1$: an alkyl group, an aryl group, a halogen atom, a nitro group, an acyl group or a cyano group.

m: an integer of 0 to 2

General formula (10)

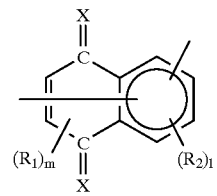

X: an oxygen atom or

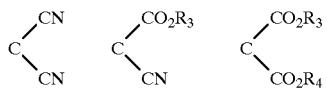

($R_3$, $R_4$: an alkyl or aryl group)

$R_1$, $R_2$: an alkyl group, an aryl group, a halogen atom, a nitro group, an acyl group or a cyano group.

M, l: an integer of 0 to 2

General formula (11)

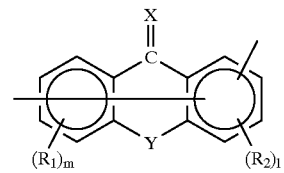

X: an oxygen atom or

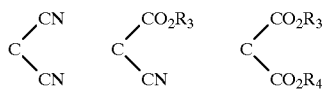

($R_2$, $R_3$: an alkyl or aryl group)

Y: C═X, O, S, SO$_2$, NR$_5$ (R$_5$: a hydrogen atom, an alkyl group, an aryl group or an acyl group)

$R_1$, $R_2$: an alkyl group, an aryl group, a halogen atom, a nitro group, an acyl group or a cyano group.

M, l: an integer of 0 to 2

General formula (12)

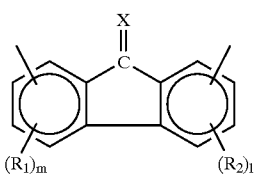

X: an oxygen atom or

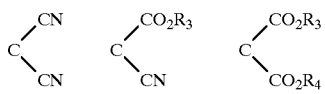

(R$_3$, R$_4$: an alkyl or aryl group)

R$_1$, R$_2$: an alkyl group, an aryl group, a halogen atom, a nitro group, an acyl group or a cyano group.

M, l: an integer of 0 to 2

General formula (13)

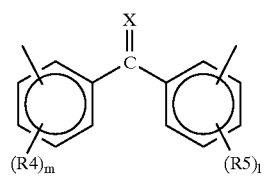

X: an oxygen atom or

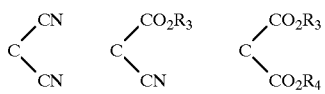

(R$_3$, R$_4$: an alkyl or aryl group)

R$_1$, R$_2$: an alkyl group, an aryl group, a halogen atom, a nitro group, an acyl group or a cyano group.

M, l: an integer of 0 to 2

General formula (14)

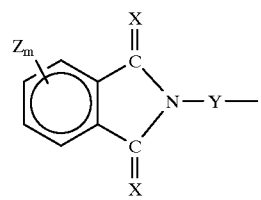

X: an oxygen atom or

Y: —COO—(CH$_2$)n or

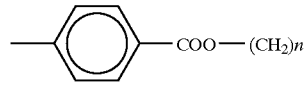

(n: an integer of 1 to 6).

Z: an alkyl group, a halogen atom, a nitro group, an acyl group or a cyano group.

m: an integer of 0 to 2

General formula (15)

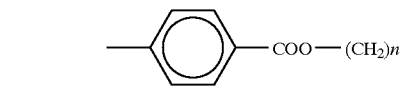

X: an oxygen atom or

Y: —COO—(CH$_2$)n or

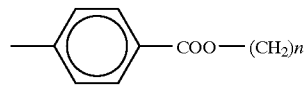

(n: an integer of 1 to 6).

Z: an alkyl group, a halogen atom, a nitro group, an acyl group or a cyano group.

M, l: an integer of 0 to 2

Specific examples of the charge transporting and electron transporting high-molecular compounds represented by the general formulas (1) to (15) are shown below (Table 1), but they are not limited thereto.

TABLE 1

Specific examples of partial structural formulas of the compounds represented by the formulas (1) to (6)

| ① | ② | P | ③ | ④ | $R_1$ | $R_2$ | $R_3$ | $R_4$ | $R_5$ | ⑤ | X | V | T | l | k | Y | Z |
|---|---|---|---|---|---|---|---|---|---|---|---|---|---|---|---|---|---|
| 1 | (1) | 165 | A | (7) | Me | Me | — | — | — | 3.4 | Me—⟨Ph⟩—⟨Ph⟩—Me (3,4-dimethyl biphenyl) —CH$_2$CH$_2$— | a = 0 | CH$_2$CH$_2$ | 1 | 1 | — | — |
|   |     |     | B |     |    |    |   |   |   |     |                                                        |       |                  |   |   |   |   |
| 2 | (1) | 55  | A | (8) | — | — | Me | Me | — | 3.4 | Me—⟨Ph⟩—⟨Ph⟩—Me —CH$_2$CH$_2$— | a = 0 | CH$_2$CH$_2$ | 1 | 1 | — | — |
|   |     |     | B |     |   |   |    |    |   |     |                                  |       |                  |   |   |   |   |
| 3 | (2) | 40  | A | (7) | Me | Me | Me | — | — | 3.4 | Me—⟨Ph⟩—⟨Ph⟩—Me —CH$_2$CH$_2$— | a = 0 | CH$_2$CH$_2$ | 1 | 1 | — | — |
|   |     |     | B |     |    |    |    |   |   |     |                                  |       |                  |   |   |   |   |
| 4 | (2) | 100 | A | (8) | — | — | Me | Me | — | 3.4 | Me—⟨Ph⟩—⟨Ph⟩—Me —CH$_2$CH$_2$— | a = 0 | CH$_2$CH$_2$ | 1 | 1 | — | — |
|   |     |     | B |     |   |   |    |    |   |     |                                  |       |                  |   |   |   |   |

TABLE 1-continued
Specific examples of partial structural formulas of the compounds represented by the formulas (1) to (6)
| ① | ② | P | ③ | ④ | R₁ | R₂ | R₃ | R₄ | R₅ | ⑤ | X | V | T | l | k | Y | Z |
|---|---|---|---|---|----|----|----|----|----|---|---|---|---|---|---|---|---|
| 5 | (3) | 60 | A | (7) | Me | Me | — | — | — | 3,4 | 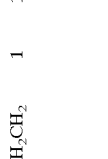 | a = 0 | CH₂CH₂ | 1 | 1 | — | — |
|   |     |    | B |     |    |    |    |    |    |     |   |   |   |   |   |   |   |
| 6 | (3) | 50 | A | (8) | —  | —  | Me | Me | — | 3,4 | 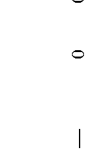 | a = 0 | CH₂CH₂ | 1 | 1 | — | — |
|   |     |    | B |     |    |    |    |    |    |     |   |   |   |   |   |   |   |
| 7 | (4) | 145 | A | (7) | Me | Me | — | — | — | 3,4 | 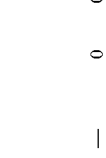 | — | — | 0 | 0 | — | — |
|   |     |    | B |     |    |    |    |    |    |     |   |   |   |   |   |   |   |
| 8 | (4) | 90 | A | (8) | —  | —  | Me | Me | — | 3,4 |  | — | — | 0 | 0 | — | — |
|   |     |    | B |     |    |    |    |    |    |     |   |   |   |   |   |   |   |
| 9 | (5) | 103 | A | (7) | Me | Me | — | — | — | 3,4 |  | — | — | 0 | 0 | — | — |
|   |     |    | B |     |    |    |    |    |    |     |   |   |   |   |   |   |   |

TABLE 1-continued

Specific examples of partial structural formulas of the compounds represented by the formulas (1) to (6)

| ① | ② | P | ③ | ④ | R$_1$ | R$_2$ | R$_3$ | R$_4$ | R$_5$ | ⑤ | X | V | T | l | k | Y | Z |
|---|---|---|---|---|---|---|---|---|---|---|---|---|---|---|---|---|---|
| 10 | (5) | 78 | A | (8) | — | — | Me | Me | — | 3.4 | ⟨phenyl, para-Me⟩— | — | — | 0 | 0 | — | — |
| 11 | (5) | 55 | B A | (8) | — | — | Me | Me | — | 3.4 | ⟨phenyl, para-Me⟩—CH$_2$— | — | — | 0 | 0 | — | — |
| 12 | (5) | 60 | B A | (8) | — | — | Me | Me | — | 3.4 | ⟨phenyl, para-Me⟩—(CH$_2$)$_2$— | — | — | 0 | 0 | — | — |
| 13 | (6) | 120 | B A | (7) | Me | Me | — | — | — | 3.4 | ⟨phenyl, para-Me⟩— | — | — | 0 | 0 | — | — |
| 14 | (6) | 48 | B A | (8) | — | — | Me | Me | — | 3.4 | ⟨phenyl, para-Me⟩— | — | — | 0 | 0 | — | — |
| 15 | (6) | 162 | B A | (8) | — | — | Me | Me | — | 3.4 | ⟨phenyl, para-Me⟩—(CH$_2$)$_2$— | — | — | 0 | 0 | — | — |

TABLE 1-continued

Specific examples of partial structural formulas of the compounds represented by the formulas (1) to (6)

| ① | ② | P | ③ | ④ | R₁ | R₂ | R₃ | R₄ | R₅ | ⑤ | X | V | T | l | k | Y | Z |
|---|---|---|---|---|----|----|----|----|----|----|---|---|---|---|---|---|---|
| 16 | (1) | 130 | B | | | | | | | | — | — | — | — | — | — | — |
| | | | A | (9) | H, m=t | | | | | | ![structure with two p-tolyl groups and C(CF₃)₂] | — | — | — | — | — | — |
| 17 | (1) | 55 | B | (10) | H, m=t | H, t=1 | | | | 1.4 | O | — | — | — | — | — | — |
| | | | A | (11) | H, m=t | H, t=1 | | | | 1.4 | ![structure with two p-tolyl groups and C(CF₃)₂] | — | — | — | — | — | — |
| 18 | (1) | 70 | B | (13) | — | — | — | — | — | 1.4 | —(CH₂)₈— O | — | — | — | — | C=O | — |
| | | | A | | | | | | | | | | | | | | |
| 19 | (1) | 89 | A | (13) | — | — | — | H, m=t | H, t=1 | 3.3 | O | — | — | — | — | — | — |
| 20 | (1) | 62 | B | (12) | — | — | — | H, m=t | H, t=1 | 3.3 | O | — | — | — | — | — | — |
| | | | A | (13) | — | — | — | H, m=t | H, t=1 | 3.3 | O | — | — | — | — | — | — |
| | | | B | (13) | — | — | — | H, m=t | H, t=1 | 3.3 | O | — | — | — | — | — | — |
| 21 | (5) | 57 | A | (14) | — | — | — | — | — | 2.2 | O | — | — | — | — | —(CH₂)₂O— | H |
| | | | B | | | | | | | | | | | | | | |
| 22 | (5) | 105 | A | (15) | — | — | — | — | — | 2.2 | O | — | — | — | — | —(CH₂)₂O— | H |
| | | | B | | | | | | | | | | | | | | |

①: High molecular compound
②: General formula
③: Partial structural formula
④: General formula
⑤: Bonded position In addition, examples of the low-molecular compounds having a positive hole transporting property among those having a charge transporting property can be shown below.

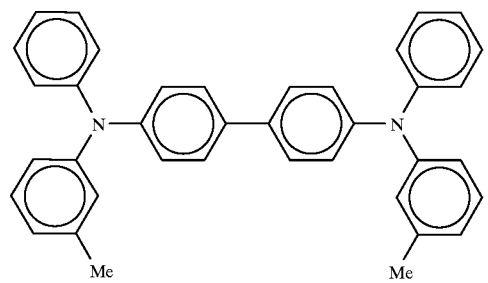
(Low-molecular compound 1)

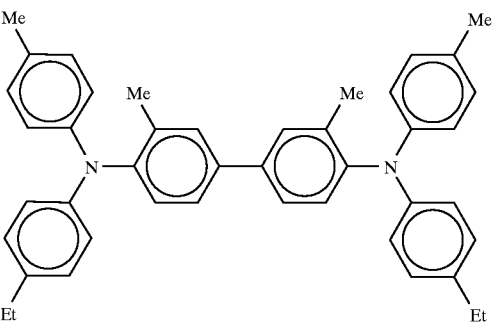
(Low-molecular compound 2)

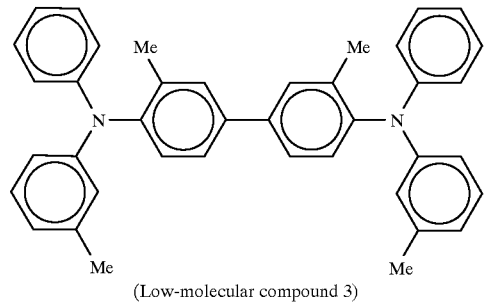
(Low-molecular compound 3)

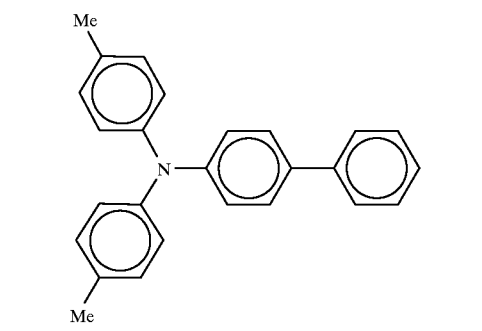
(Low-molecular compound 4)

-continued

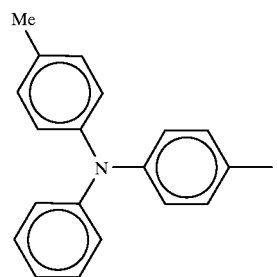
(Low-molecular compound 5)

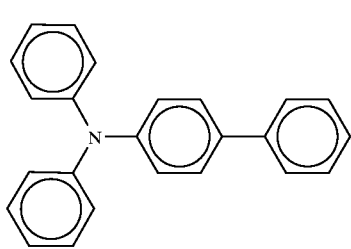
(Low-molecular compound 6)

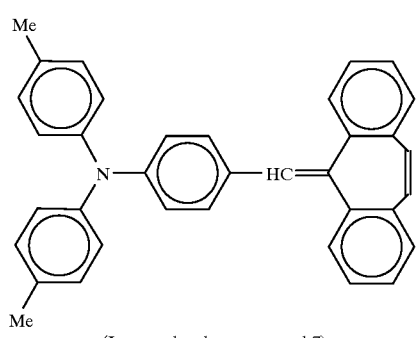
(Low-molecular compound 7)

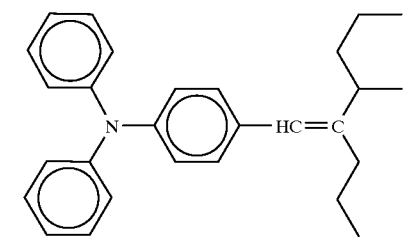
(Low-molecular compound 8)

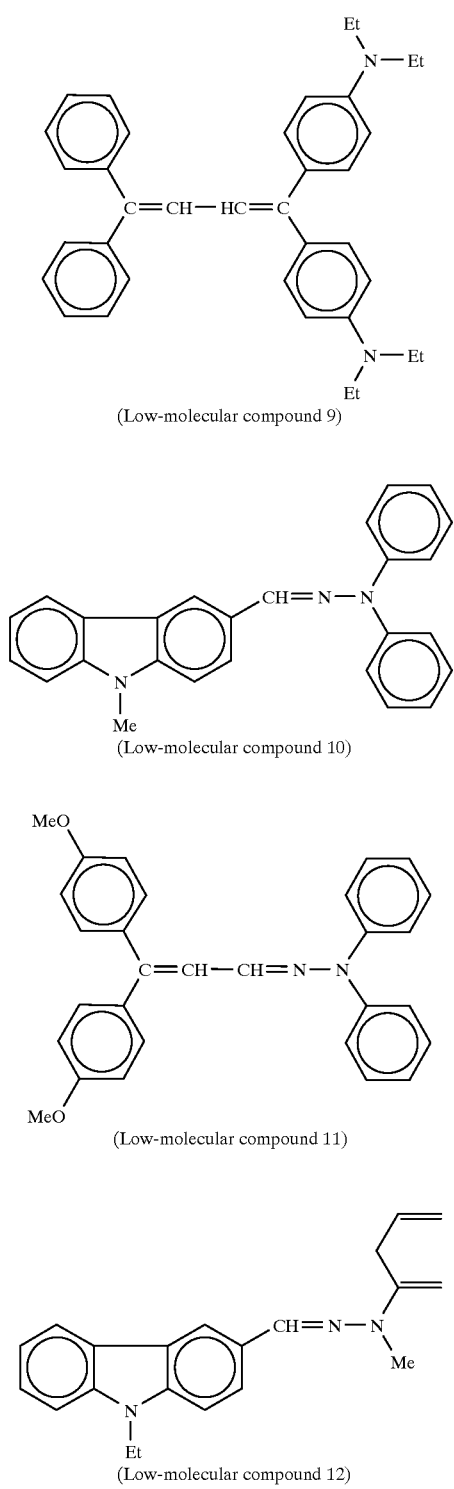
(Low-molecular compound 9)
(Low-molecular compound 10)
(Low-molecular compound 11)
(Low-molecular compound 12)
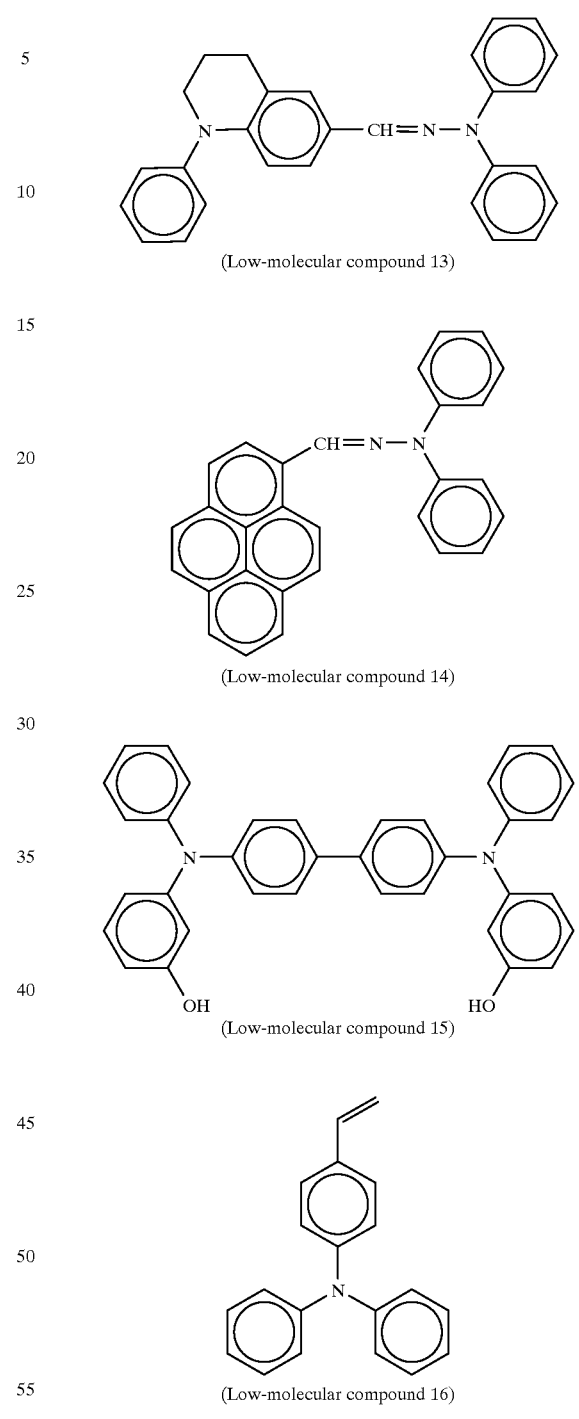
(Low-molecular compound 13)
(Low-molecular compound 14)
(Low-molecular compound 15)
(Low-molecular compound 16)

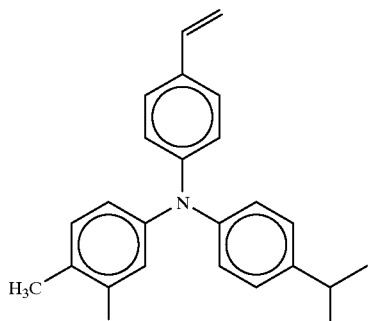

(Low-molecular compound 17)

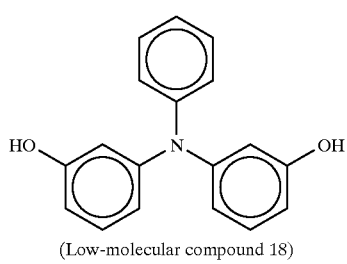

(Low-molecular compound 18)

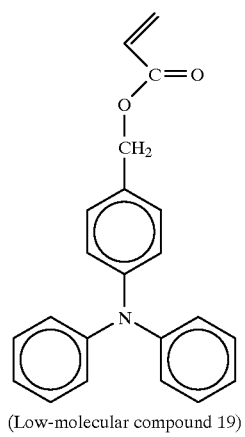

(Low-molecular compound 19)

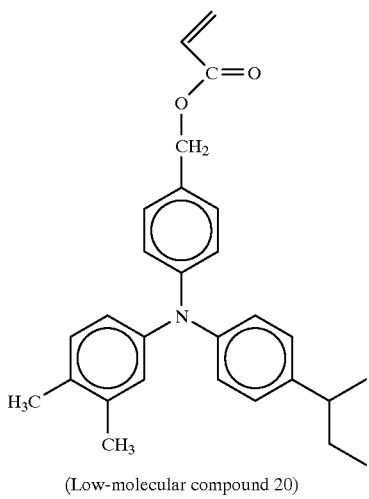

(Low-molecular compound 20)

As examples of low-molecular compounds having an electron transporting property, the following compounds can be given.

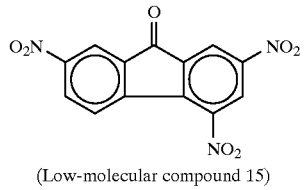

(Low-molecular compound 15)

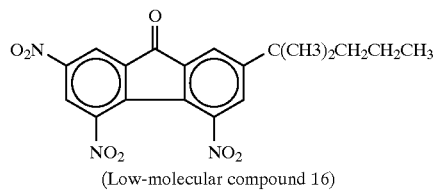

(Low-molecular compound 16)

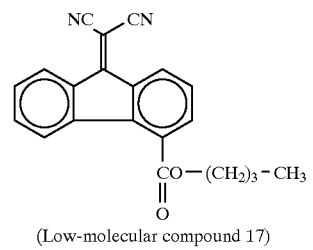

(Low-molecular compound 17)

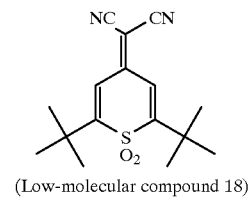

(Low-molecular compound 18)

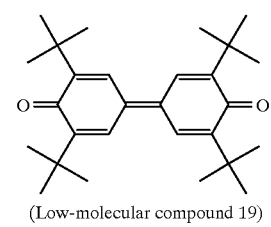

(Low-molecular compound 19)

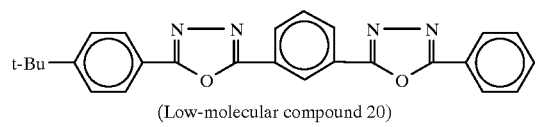

(Low-molecular compound 20)

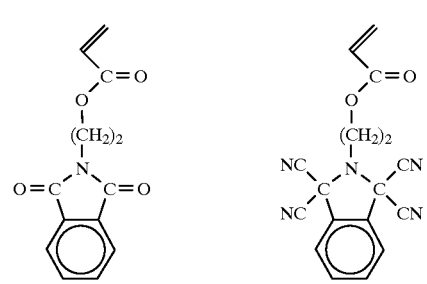

(Low-molecular compound 27)

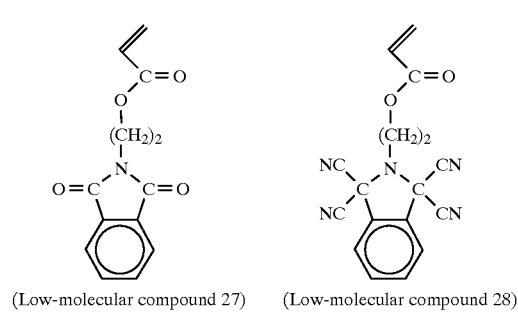

(Low-molecular compound 28)

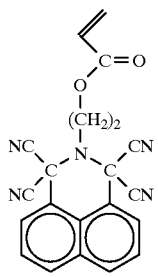

(Low-molecular compound 29)

Charge transporting fine particles according to the present invention may comprise fine particles formed with a charge transporting compound as a main component and, on the surface thereof, a layer formed of a second compound which may react with the charge transporting compound constituting the fine particles, in otherwords, they may be fine particles having a surface at least a portion thereof being covered with a second compound (which will hereinafter be called a "covering component" where suitable) which may react with the charge transporting compound. Such a layer is useful for improving the solvent resistance or strength of the charge transporting material.

Figure 1B:
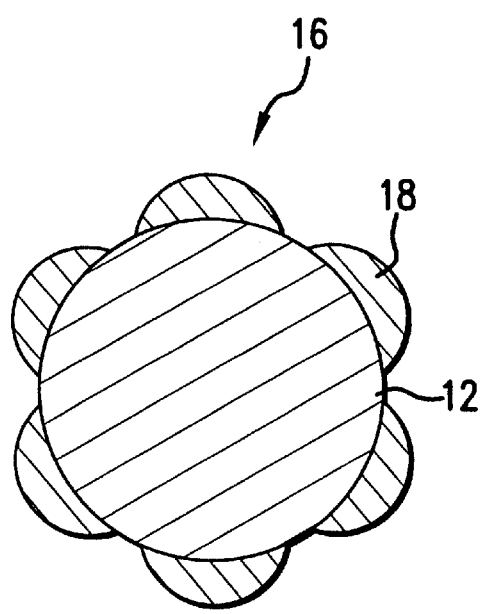
FIG. 1B is a model cross-sectional view illustrating charge transporting fine particles using a material with no charge transporting properties as a covering component.

FIGS. 1A and 1B are model cross-sectional views of charge transporting fine particles of the present invention having a covering layer formed on a portion of their surface by a covering component. FIG. 1A illustrates charge transporting fine particles formed with a charge transporting compound as a covering component. Charge transporting fine particles 10 have a covering layer 14 formed of a second charge transporting compound on a portion of the surface of core substance fine particles 12 composed of a charge transporting compound. By using as the second charge transporting compound a compound having high solvent resistance, the charge transporting fine particles 10 have both a high charge transporting properties and solvent resistance.

FIG. 1B illustrates charge transporting fine particles when a material lacking in charge transporting properties was used as a covering component. The charge transporting fine particles 16 have a covering layer 18, which is formed of a high molecular or low molecular compound lacking in a charge transporting property and having high solvent resistance, on a portion of the surface of the core substance fine particles 12 composed of a charge transporting compound. By using a covering material which can react with the charge transporting compound which is to become the core, a firm covering layer can be formed. It is preferable to control the amount of the covering component or covering conditions according to the desired strength or the balance between solvent resistance and charge transporting ability when such a covering component is employed.

The fine particles having a layer formed of the second compound which may react with the charge transporting compound can also be prepared in a manner as described above. Namely, a compound having charge transporting properties and a second compound which is a covering component are dissolved or dispersed in a specific organic solvent permitting the dissolution or dispersion of both compounds, thereby forming an oil phase, which is subjected to emulsion dispersion in an aqueous medium, and the organic solvent which is the first medium is removed from the resulting emulsion, whereby the charge transporting fine particles of the present invention having a surface at least partially covered with the second compound and having an average particle size of about 0.01 to 10 μm can be obtained.

The fine particles so obtained may be subjected to a washing operation and filtration and then provided for use in the form of fine particles alone, or after solvent substitution, may be used in the form of a dispersed solution.

At this time, the covering component can be modified by incorporating as needed a third component which may react with the second compound forming the covering layer in an aqueous medium.

Examples of the second compound (covering component) which covers the charge transporting fine particles and may react with the compound having charge transporting properties include silyl isocyanate compounds, multivalent,isocyanate compounds, silane coupling agents and titanate coupling agents and the like. The second compound is added in an amount of 0.1 to 90% by weight, preferably 1 to 60% by weight relative to the charge transporting compound.

Examples of the component which reacts with a charge transporting compound and covers the same include, but not limited thereto, the compounds which will be exemplified below.

For example, examples of the silyl isocyanate compound include silyl isocyanate derivatives represented by the following formulas (17), (18) and (19) and condensates thereof.

General formula (17)

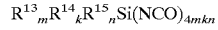

General formula (18)

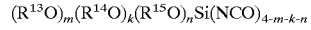

General formula (19)

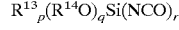

wherein $R^{13}$, $R^{14}$ and $R^{15}$ each independently represents an alkyl, aryl or alkenyl group; m, k and n each independently represents an integer of 0 to 3 and they satisfy the equation: $m+k+n \leq 3$; and p, q and r each independently stands for an integer of 1 or 2 and they satisfy the equation: $p+q+r=4$.

Specific examples of the silyl isocyanate compound include $(CH_3)_3SiNCO$, $(C_2H_5)_3SiNCO$, $(C_3H_7)_3SiNCO$, $(C_4H_9)SiNCO$, $(CH_3)(C_2H_5)(C_3H_7)SiNCO$, $(CH_3)(C_2H_5)SiNCO$, $(CH_3)_2(C_2H_5)SiNCO$, $(CH_3)_2Si(NCO)_2$, $(C_2H_5)_2Si(NCO)_2$, $(C_3H_7)_2Si(NCO)_2$, $(C_4H_9)_2Si(NCO)_2$, $CH_3Si(NCO)_3$, $C_2H_5Si(NCO)_3$, $C_3H_7Si(NCO)_3$, $C_4H_9Si(NCO)_3$, $CH_2=CHSi(NCO)_3$, $CH_2=C(CH_3)Si(NCO)_3$, $(CH_3O)_3SiNCO$, $(C_2H_5O)_3SiNCO$, $(C_3H_7O)_3SiNCO$ and $(C_4H_9O)_3SiNCO$, and the like.

It is also possible to use a multivalent isocyanate compound. Specific examples include diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-4,4-biphenyl-diisocyanate, 3,3'-dimethylphenylmethane-4,4'-diisocyanate, xylylene-1, 4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate and cyclohexylene-1,4-diisocyanate; triisocyanates such as 4,4',4"-triphenylmethane triisocyanate and toluene-2,4,6-triisocyanate; tetraisocyanates such as 4,4'-dimethyldiphenylmethane-2,2', 5,5'-tetraisocyanate; and isocyanate prepolymers such as an adduct of hexamethylene diisocyanate and trimethylolpropane, an adduct of 2,4-tolylene diisocyanate and trimethylolpropane, an adduct of xylylene diisocyanate and trimethylolpropane and an adduct of tolylene diisocyanate and hexanetriol.

As silane coupling agents and titanate coupling agents, the following examples can be given. Specific examples include publicly known compounds such as vinyltrimethoxysilane, vinyltriethoxysilane, tris-(β-methoxyethoxy)vinylsilane, vinyltriacetoxysilane, γ-methacryloxypropyltrimethoxysilane, γ-glycidoxypropyltrimethoxysilane, β-(3,4-epoxycyclohexyl)ethyltrimethoxysilane, γ-mercaptopropyltrimethoxysilane, β-mercaptoethyltrimethoxysilane, γ-chloropropyltrimethoxysilane, isopropyltristearoyl titanate and isopropylmethacryl isostearoyl titanate.

The above-described second compounds which are employed as the covering component do not themselves have charge transporting properties and mainly serve as protective layering. It is not always necessary for these covering layers to be formed over the whole region of the surface of the fine particles, instead they are selected for use from a range of compounds having the properties necessary for protecting the solvent or additive used in combination with the charge transporting material, and at the same time not inhibiting the charge transporting properties of the charge transporting compound which is a core substance.

To further improve the charge transporting performance, it is possible to use a compound which has charge transporting properties itself as the covering component. Examples of a compound imparted with charge transporting properties include compounds represented by the following general formula (16):

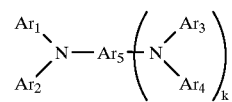

The amount of these second compounds contained in the charge transporting compound is 0.1 to 90% by weight, and preferably 1 to 60% by weight. In the above-exemplified compound represented by the general formula (16), the component, which covers the charge transporting compound, itself has charge transporting properties so that the second compound can be used alone for the formation of fine particles which can be used as the charge transporting material of the present invention.

Specific examples of the compound are shown below in Table 2.

TABLE 2

Specific examples of the partial structural formula of the compound represented by the formula (16)

General formula (16):

$$\mathrm{Ar_1} \diagdown_{\mathrm{Ar_2}}^{} \mathrm{N-Ar_5} {\left( \diagdown_{\mathrm{Ar_4}}^{\mathrm{Ar_3}} \right)}_k$$

| * | k | Ar₁ | Ar₂ | Ar₃ | Ar₄ | Ar₅ | Ar₆ | X |
|---|---|---|---|---|---|---|---|---|
| 1 | 0 | 2,4-diMe-phenyl | biphenyl | — | — | | 4-X-phenyl | —CH₂CH₂—(CH₂)₂—Si(OMe)₃ |
| 2 | 0 | 2,4-diMe-phenyl | biphenyl | — | — | | 4-X-phenyl | —CH₂CH₂—(CH₂)₂—Si(OEt)₃ |
| 3 | 1 | 2,4-diMe-phenyl | phenyl | 4-X-phenyl | 2,4-diMe-phenyl | | 3,3'-diMe-biphenyl | —CH₂CH₂—(CH₂)₂—Si(OMe)₃ |
| 4 | 1 | 2,4-diMe-phenyl | phenyl | 4-X-phenyl | 2,4-diMe-phenyl | | 3,3'-diMe-biphenyl | —CH₂CH₂—(CH₂)₂—Si(OMe)₃ |

*: Compound

Next, the process for the preparation of charge transporting fine particles used for the charge transporting material of the present invention will be described in detail.

The first medium used for the preparation of charge transporting fine particles having an average particle size of 0.01 to 50 μm, and showing a GSD value, which indicates the particle size distribution, of 1.0 to 2.0, and thus having a narrow distribution, must be a material able to dissolve or disperse the charge transporting compound and the second compound, which can react with and cover the charge transporting compound when required. Examples of an oil medium include acetate esters such as ethyl acetate, halogenated hydrocarbons such as methylene chloride, aromatic hydrocarbons such as toluene and xylene and ketones such as methyl isobutyl ketone.

When a second compound is used which reacts with the charge transporting compound and forms a covering layer thereon, it is possible to add where required to the first medium a component with which the charge transporting compound reacts and crosslinks, for example, divinyl benzene or 2-hydroxyethyl methacrylate.

Examples of an aqueous medium include water and aliphatic alcohols such as methyl alcohol and ethyl alcohol. However, as far as a medium permits the dissolution of the charge transporting compound used in the present invention, the medium is not limited to the above-exemplified aqueous mediums.

As the second liquid medium in which the first medium permitting the dissolution of the above-described charge transporting compound and the like is dispersed, any medium that is different from the first medium and permits granulation of the first medium can be used. When the first medium is an oil medium, preferably used are water and aliphatic alcohols such as methyl alcohol and ethyl alcohol. When the first medium is an aqueous medium, on the other hand, preferably used are acetates such as ethyl acetate, halogenated hydrocarbons such as methylene chloride; aromatic hydrocarbons such as toluene and xylene; and ketones such as methyl isobutyl ketone.

It is also possible to allow to react, as needed, the second compound (covering component), which may react with a compound having charge transporting properties contained in the aforementioned medium, with another component (third component) contained in the second liquid medium. In this case, as the third compound capable of reacting with the covering component, a polyol, polyamine or the like can be used.

Examples of the polyol include aliphatic and aromatic polyhydric alcohols, hydroxypolyester and hydroxypolyalkylene ethers. Specific examples of the polyol include ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol and pentaerythritol.

Specific examples of the polyamine include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hyroxytrimethylenediamine, diethylenetriamine, triethylenetriamine, triethylenetetramine, diethylaminopropylamine, tetraethylenepentamine and amine adducts of an epoxy compound.

The above-exemplified compounds are preferably used in an amount ranging from equimolor to 5 times the molar amount of the compound serving as the covering component.

It is also possible to incorporate a protective colloid in advance in the second liquid medium in order to disperse the solution or dispersion, which has been obtained by dissolving or dispersing the compound having a charge transporting property in the first medium, in the second liquid medium. In cases where an aqueous medium is used, a water-soluble high-molecular compound can be incorporated as the protective colloid and it can be selected as needed from publicly known anionic high-molecular compounds, nonionic high-molecular compounds and amphoteric high-molecular compounds, with the incorporation of polyvinyl alcohol, gelatin or a cellulose based water-soluble high-molecular compound being particularly preferred.

In the above-described liquid medium, a surfactant can also be added. As the surfactant, anionic or nonionic surfactants can be used as needed insofar as they do not cause precipitation or coagulation, acting with the protective colloid. Specific examples include sodium alkylbenzenesulfonates (for example, sodium laurylsulfate), sodium dioctyl sulfosuccinate and polyalkylene glycols (for example, polyoxyethylene nonylphenyl ether). While the surfactant can be used in a controlled amount required in order to obtain the desired particle size, it is preferably used in an amount of 0.01 to 40% by weight, with 0.1 to 20% by weight being more preferred.

EXAMPLES

Example 1

In 150 g of toluene as the first medium, 20 g of a polyester resin (high-molecular compound 1) as shown in Table 1 was dissolved as a charge transporting high-molecular compound, whereby an oil component was prepared.

The resulting oil phase was added to 1.0 kg of a 1.0% aqueous solution of polyvinyl alcohol as an aqueous medium, that is, the second medium, followed by emulsion dispersion at a rotating speed of 8000 rpm. From the resulting emulsion, toluene was removed in a thermostatic chamber of 60° C. for 3 hours at normal pressure, whereby fine particles were formed. The resulting fine particles were washed with distilled water, followed by lyophilization, whereby 20 g of charge transporting fine particles was obtained.

The particle size and particle size distribution were measured by a laser diffraction type particle size distribution measuring apparatus, "SALD-2000A" manufactured by Shimadzu Corporation. As a result, the average particle size was 0.2 μm, while the GSD value determined from the average particle size of the whole volume was 1.20.

The solubility of the fine particles in an organic solvent was studied. It was then confirmed that they were insoluble in an alcohol such as methyl alcohol or ethyl alcohol, or an aliphatic hydrocarbon solvent such as n-hexane.

Example 2

In the same manner as Example 1, except that as the charge transporting high-molecular compound, the high-molecular compound 1 was replaced by 25 g of an acrylic resin (high-molecular compound 12) as shown in Table 1; and 1.0 kg of a 1.0% aqueous solution of hexadecyl pyridinium chloride monohydrate was employed as the second medium, 20 g of charge transporting fine particles was obtained. As a result of measurement as in Example 1, the average diameter and GSD value of the resulting fine particles were 0.3 μm and 1.10, respectively.

The solubility of the resulting fine particles in an organic solvent was studied. As a result, it was confirmed that they were insoluble in an alcohol such as methyl alcohol or ethyl alcohol or an aliphatic hydrocarbon solvent such as n-hexane.

Example 3

In the same manner as Example 1, except that 20 g of a polyester resin (high-molecular compound 17) as shown in Table 1 was employed as the charge transporting high-molecular compound, 15 g of charge transporting fine particles was obtained. As a result of measurement as in Example 1, the average diameter and GSD value of the resulting fine particles were 0.2 μm and 1.20, respectively.

The solubility of the resulting fine particles in an organic solvent was studied. As a result, it was confirmed that they were insoluble in an alcohol such as methyl alcohol or ethyl alcohol or an aliphatic hydrocarbon solvent such as n-hexane.

Example 4

In the same manner as Example 2 except that 20 g of an acrylic resin (high-molecular compound 21) as shown in Table 1 was employed as the charge transporting high-molecular compound, 17 g of charge transporting fine particles was obtained. As a result of measurement as in Example 1, the average diameter and GSD value of the resulting fine particles were 0.2 μm and 1.20, respectively.

The solubility of the resulting fine particles in an organic solvent was studied. As a result, it was confirmed that they were insoluble in an alcohol such as methyl alcohol or ethyl alcohol or an aliphatic hydrocarbon solvent such as n-hexane.

Example 5

In 150 g of toluene, that is, the first medium, 20 g of a polyester resin (1) as shown in Table 1 was dissolved as the charge transporting high-molecular compound, followed by the addition of 3.0 g of a 3 mole adduct of trimethylol propanexylidene diisocyanate ("Takanate D110N", product of Takeda Chemical Industries) as a compound reactive with the charge transporting high-molecular compound, whereby an oil-phase mixed solution was prepared.

The resulting oil-phase mixed solution was added to 1.0 kg of a 1.0% aqueous solution of polyvinyl alcohol as an aqueous medium, that is, the second medium, followed by emulsion dispersion at a rotating speed of 8000 rpm. From the resulting emulsion, toluene was removed in a thermostatic chamber of 60° C. for 3 hours at normal pressure, whereby fine particles were formed. The resulting fine particles were washed with distilled water, followed by lyophilization, whereby 20 g of charge transporting fine particles was obtained.

The particle size and particle size distribution were measured as in Example 1. As a result, the average particle size was 0.2 μm, while the GSD value was 1.20.

The solubility of the charge transporting fine particles in an organic solvent was studied. It was then confirmed that they were insoluble in an ester, amide, halogen or sulfoxide type solvent.

Example 6

In a similar manner to Example 5 except that 25 g of an acrylic resin (11) as shown in Table 1 was used as the charge transporting high-molecular compound instead of the polyester resin, 4.1 g of a compound represented by the formula (17) was used as a compound reactive with an aqueous medium, and 1.0 kg of a 1.0% aqueous solution of hexadecyl pyridinium chloride monohydrate was used as the aqueous medium, 20 g of charge transporting fine particles having an average particle size of 0.3 μm and GSD of 1.10 in the measurement of the particle size and particle size distribution as in Example 1 was obtained.

The solubility of the charge transporting fine particles in an organic solvent was studied. It was then confirmed that they were insoluble in an ester, amide, halogen or sulfoxide type solvent.

Example 7

In a similar manner to Example 5 except that 20 g of a covering compound (11), which was shown in Table 2 and had charge transporting properties, was used alone as the charge transporting high-molecular compound instead of the polyester resin, 20 g of charge transporting fine particles having an average particle size of 0.1 μm and GSD of 1.10 in the measurement of the particle size and particle size distribution as in Example 1 was obtained.

The solubility of the charge transporting fine particles in an organic solvent was studied. As a result, it was confirmed that they were insoluble in an ester, amide, halogen or sulfoxide type solvent.

Example 8

In a similar manner to Example 1 except that 20 g of the above-described charge-transporting low molecular compound 1 was used instead of the charge transporting high-molecular compound used in Example 5, 15 g of charge transporting fine particles having an average particle size of 0.1 μm and GSD of 1.50 in the measurement of the particle size and particle size distribution as in Example 1 was obtained.

The solubility of the charge transporting fine particles in an organic solvent was studied. As a result, it was confirmed that they were insoluble in an ester, amide, halogen or sulfoxide type solvent.

Example 9

In a similar manner to Example 5 except that 20 g of the above-described charge-transporting high-molecular compound (16) as shown in Table 1 was used instead of the charge transporting high-molecular compound in Example 5, 15 g of fine particles having an average particle size of 0.2 μm in the measurement of the particle size and particle size distribution as in Example 1 was obtained.

The solubility of the charge transporting fine particles in an organic solvent was studied. It was then confirmed that they were insoluble in an ester, amide, halogen or sulfoxide type solvent.

Example 10

In a similar manner to Example 6 except that a 1.0% aqueous solution of hexadecyl pyridinium chloride monohydride was replaced by 500 g of a 2.0% aqueous solution of carboxymethyl cellulose as the aqueous medium, 20 g of fine particles having an average particle size of 0.1 μm in the measurement of the particle size and particle size distribution as in Example 1 was obtained. The solubility of the fine particles in an organic solvent showed the same results as in Example 5.

Example 11

In a similar manner to Example 5 except that 4.1 g of Compound (1) as shown in Table 2 were used as a compound reactive with the charge transporting high-molecular compound or aqueous medium, 20 g of fine particles having an average particle size of 0.1 μm in the measurement of the particle size and particle size distribution as in Example 1 was obtained.

The solubility of the fine particles in an organic solvent showed the same results as in Example 5.

(Application Example 1)

On an aluminum substrate, a solution composed of 20 parts by weight of a zirconium alkoxide compound ("Organotix ZC540", product of Matsumoto Chemical Industry Co., Ltd.), 2 parts by weight of Y-aminopropyltriethoxysilane ("A1100", product of Nippon Unicar Co., Ltd.), 1 part by weight of a polyvinyl butyral resin ("S-lec BM-S", product of Sekisui Chemical Co., Ltd.), and 50 parts by weight of n-butanol was dip-coated, followed by drying under heat at 175° C. for 15 minutes, whereby an undercoat layer having a layer thickness of 1.0 μm was formed. On the resulting undercoat layer was dip-coated a dispersion which had been obtained by dispersing, in a sand grinder mill for 2 hours, 4 parts by weight of chloro-gallium phthalocyanine crystallite in 2 parts by weight of a vinyl chloride-vinyl acetate copolymer ("VMCH", product of Union Carbide Co., Ltd.), 67 parts by weight of xylene, and 33 parts by weight of butyl acetate, together with 1 mmφ glass beads, followed by drying under heat at 100° C. for 10 minutes, whereby a charge generating layer having a layer thickness of 0.25 μm was formed.

The resulting charge generating layer was dip-coated with a coating liquid obtained by dispersing 5 parts by weight of charge transporting fine particles obtained above in Example 1, in a resin solution having 5 parts by weight of a polyolefin resin ("Zeonex 450", product of Nippon Zeon Co., Ltd.) dissolved in 40 parts of cyclohexane, followed by drying under heat at 150° C. for one hour, whereby a heterogeneous layer having a layer thickness of 20 μm was formed.

The electric characteristics of the electrophotographic photoreceptor so obtained were evaluated using a static copying paper testing apparatus ("Electrostatic analyzer EPA-8100", product of Kawaguchi Denki Seisakujo) at 25° C. and 40%RH. The corona discharge voltage was adjusted and the surface of the photoreceptor was then charged with −750 V. After a halogen lamp light, which had been monochromatized to 750 nm through an interference filter, was adjusted to have a light intensity of 10 mW/m² on the surface of the photoreceptor, the charged surface of the photoreceptor was exposed to the light for 10 seconds. As a result, an $E_{50\%}/E_{10\%}$ value (S-shape: $1<E_{50\%}/E_{10\%}<5$, J-shape: $5<E_{50\%}/E_{10\%}$) was 1.9, showing S-type inductive potential attenuating characteristics. The $E_{50\%}$ value was 3.1 mJ/m². A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 3.

(Comparative Application Example 1)

An electrographic photoreceptor was prepared in the same way as in Application Example 1, except that 5.5 parts by weight of a positive hole transporting low-molecular compound represented by the below-described formula were pulverized mechanically in a planetary ball mill (product of Philish Japan) for 12 hours. Next, a coating solution obtained by dispersing 5 parts by weight of the resulting crystallite in a coating liquid, which had been obtained by dispersing a polyvinyl butyral resin ("S-lec BM-S", product of Sekisui Chemical) in 40 parts of n-butanol, was dip-coated on a charge generating layer and after drying of the dip-coated layer under heat at 150° C. for one hour, a heterogeneous layer having a layer thickness of 20 μm was formed.

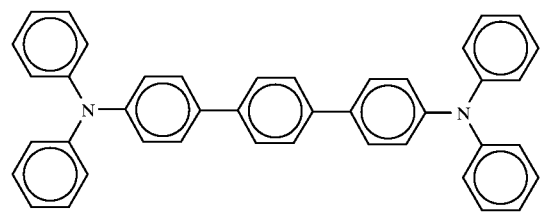

As in Application Example 1, the electrophotographic properties were evaluated. As a result, the $E_{50\%}/E_{10\%}$ value was 5.0, showing J-type inductive potential attenuating characteristics. The $E_{50\%}$ value was 4.2 mJ/m². A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 3.

(Application Example 2)

On an aluminum substrate, a dispersion, which had been obtained by dispersing 5 parts by weight of the charge transporting fine particles obtained in Example 3 together with 2 parts by weight of a polyvinyl butyral resin ("S-lec BM-S", product of Sekisui Chemical), 50 part by weight of n-butanol and 1 mmφ glass beads in the sand grinder mill for two hours, was dip-coated, then dried under heat at 115° C. for 15 minutes, whereby an undercoat layer having a layer thickness of 1.0 μm was formed. On the resulting undercoat layer, a dispersion which had been obtained by dispersing, in a sand grinder mill for 2 hours, 4 parts by weight of chloro-gallium phthalocyanine crystallite in 2 parts by weight of a vinyl chloride-vinyl acetate copolymer ("VMCH", product of Union Carbide), 67 parts by weight of xylene, and 33 parts by weight of butyl acetate, together with 1 mmφ glass beads, was dip-coated, then dried under heat at 100° C. for 10 minutes, whereby a charge generating layer having a layer thickness of 0.25 μm was formed. The aluminum plate having the resulting charge generating layer formed thereon was dip-coated with a coating liquid obtained by dissolving 32 parts by weight of N-(4-methylphenyl)-N-(3,4-dimethylphenyl)biphenyl-4-amine, and 3 parts of a polycarbonate resin represented by the formula (IV) in 20 parts of monochlorobenzene, followed by drying under heat at 120° C. for one hour, whereby a charge transporting layer having a layer thickness of 20 μm was formed.

The electric characteristics of the electrophotographic photoreceptor so obtained were evaluated using a static copying paper testing apparatus ("Electrostatic analyzer EPA-8100", product of Kawaguchi Denki Seisakujo) at 25° C. and 40% RH. A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 3.

(Comparative Application Example 2)

An electrophotographic photoreceptor was fabricated in a similar manner to Application Example 2, except that an aluminum substrate was dip-coated with a coating solution having 5 parts of methoxymethylated nylon ("Trezin EF-30T", product of Teikoku Chemical Industries Co., Ltd.) dissolved in 90 parts of methanol, and then dried under heat at 100° C. for 5 minutes to form an undercoat layer having a layer thickness of 1.0 μm, and the electrophotographic properties thereof were evaluated. The resulting electrophotographic photoreceptor was mounted on a laser beam printer ("FX XP-15", product of Fuji Xerox) and a copying picture was formed, by which maintenance of electric characteristics after copying 3000 times, and maintenance of picture quality after copying 20000 times were confirmed. The results are shown in Table 3.

(Comparative Application Example 3)

An electrophotographic photoreceptor was prepared in the same way as in Application Example 1, except that after a charge transporting low-molecular compound (2) was pulverized mechanically for 12 hours in a planetary ball mill (product of Philish Japan), a coating solution obtained by dispersing 5 parts by weight of the resulting crystallite in a resin solution, which had been obtained by dissolving 5 parts by weight of a polyolefin resin ("Zeonex 450", product of Nippon Zeon) in 40 parts of cyclohexane, was dip-coated on a charge generating layer, and after drying of the dip-coated layer under heat at 150° C. for one hour, a heterogeneous layer having a layer thickness of 20 μm was formed. As a result of evaluation of the electrophotographic properties in the same way as in Application Example 1, the $E_{50\%}/E_{10\%}$ value was 5.0, showing a J shape. The $E_{50\%}$ value was 4.2 mJ/m$^2$. A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 4.

(Application Example 4)

On an aluminum substrate, a dispersion obtained by dispersing 5 parts by weight of the charge transporting fine particles obtained in Example 8, together with 2 parts by weight of a polyvinyl butyral resin ("S-lec BM-S", product

TABLE 3

Evaluation results of Application Examples 1–2, and Comparative Application Examples 1–2.

| | Particulate compound | $V_0$ (V) | $E_{50\%}$ (mJ/m$^2$) | DDR (%) | $V_{RP}$ (V) | $V_0$ (V) | $E_{50\%}$ (mJ/m$^2$) | DDR (%) | $V_{RP}$ (V) | Shape | Copied picture quality (after 20000 times) |
|---|---|---|---|---|---|---|---|---|---|---|---|
| | | Initial characteristics (once) | | | | Maintained characteristics (3000 times) | | | | | |
| Application Example 1 | Example 1 | −750 | 3.1 | 2.0 | 21 | −750 | 3.1 | 2.0 | 22 | S-shape | No defects |
| Comparative Application Example 1 | — | −750 | 4.2 | 2.0 | 33 | −740 | 4.2 | 2.0 | 41 | J-shape | Frequent occurrence of black micro-spots |
| Application Example 2 | Example 3 | −750 | 3.1 | 2.0 | 23 | −742 | 3.1 | 2.0 | 24 | — | No defects |
| Comparative Application Example 2 | — | −750 | 4.5 | 2.0 | 30 | −675 | 5.5 | 2.2 | 42 | — | Frequent occurrence of black micro-spots |

(Application Example 3)

An electrophotographic photoreceptor was obtained in the same way as in Application Example 1, except that the charge transporting fine particles obtained in Example 1 were replaced by the charge transporting fine particles obtained in Example 10.

As in Application Example 1, the electric characteristics of the resulting photoreceptor were evaluated. As a result, an $E_{50\%}/E_{10\%}$ value (S-shape: $1<E_{50\%}/E_{10\%}<5$, J-shape: $5<E_{50\%}/E_{10\%}$) was 1.9, showing S-type inductive potential attenuating characteristics. The $E_{50\%}$ value was 3.0 mJ/m$^2$. A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 4.

of Sekisui Chemical), 50 parts by weight of n-butanol, and 1 mmϕ glass beads in a sand grinder mill for two hours was dip-coated, followed by drying under heat at 115° C. for 15 minutes, whereby an undercoat layer having a layer thickness of 1.0 μm was formed. On the resulting undercoat layer, a dispersion which had been obtained by dispersing, in a sand grinder mill for 2 hours, 4 parts by weight of chlorogallium phthalocyanine crystallite in 2 parts by weight of vinyl chloride-vinyl acetate copolymer ("VMCH", product of Union Carbide), 67 parts by weight of xylene, and 33 parts by weight of butyl acetate, together with 1 mmϕ glass beads, was dip-coated, then dried under heat at 100° C. for 10 minutes, whereby a charge generating layer having a layer thickness of 0.25 μm was formed. The aluminum plate having the resulting charge generating layer formed thereon was coated by the dip coating method with a coating liquid obtained by dissolving 32 parts by weight of N-(4-methylphenyl)-N-(3,4-dimethylphenyl)biphenyl-4-amine, and 3 parts of a polycarbonate resin represented by the formula (IV) in 20 parts of monochlorobenzene, followed by drying under heat at 120° C. for one hour, whereby a charge transporting layer having a layer thickness of 20 μm was formed.

The electric characteristics of the electrophotographic photoreceptor so obtained were evaluated using a static copying paper testing apparatus ("Electrostatic analyzer EPA-8100", product of Kawaguchi Denki Seisakujo) at 25° C. and 40% RH. A photosensitive layer having the above constitution was formed on an aluminum drum instead of the aluminum substrate, which was then mounted on a laser beam printer ("FX XP-15", product of Fuji Xerox), by which maintenance of electric characteristics after copying 3000 times, and maintenance of picture quality after copying 20000 times were confirmed. The results are shown in Table 4.

(Comparative Application Example 4)

An electrophotographic photoreceptor was prepared in the same way as in Application Example 3 except that an aluminum substrate was dip-coated with a coating solution having 5 parts of methoxymethylated nylon ("Trezin EF-30T", product of Teikoku Chemical Industries) dissolved in 90 parts of methanol, and then dried under heat at 100° C. for 15 minutes to form an undercoat layer having a layer thickness of 1.0 μm, and the electron photographic properties thereof were evaluated. The resulting electrophotographic photoreceptor was mounted on a laser beam printer ("FX XP-15", product of Fuji Xerox) and a copying picture was formed, by which maintenance of electric characteristics after copying 3000 times, and maintenance of picture quality after copying 20000 times were confirmed. The results are shown in Table 4.

The charge transporting material composed of the charge transporting fine particles of the present invention is excellent in solvent resistance and thermal stability, and permits the formation of a highly durable dispersion layer so that it is useful for various organic electronic devices such as an electrophotographic photoreceptor, an organic EL device and an organic solar cell. Above all, it is suited as a material for a heterogeneous charge transporting layer or an undercoat layer in an electrophotographic photoreceptor. According to the production process of the present invention, charge transporting fine particles having a useful particle size distribution for the charge transporting material can be prepared conveniently and moreover, charge transporting fine particles allowing a high degree of freedom in designing of the device can be provided.

What is claimed is:

1. A charge transporting material comprising charge transporting fine particles formed with a charge transporting organic compound as an essential component, wherein said charge transporting compound is a high-molecular compound represented by any one of the following general formulas (1) to (6):

general formula (1):

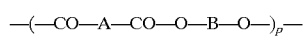

general formula (2):

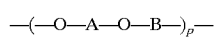

general formula (3):

TABLE 4

Evaluation results of Application Examples 3–4, and Comparative Application Examples 3–4.

| | Particulate compound | Initial characteristics (once) | | | | Maintained characteristics (3000 times) | | | | Shape | Copied picture quality (after 20000 times) |
| --- | --- | --- | --- | --- | --- | --- | --- | --- | --- | --- | --- |
| | | $V_0$ (V) | $E_{50\%}$ (mJ/m²) | DDR (%) | $V_{RP}$ (V) | $V_0$ (V) | $E_{50\%}$ (mJ/m²) | DDR (%) | $V_{RP}$ (V) | | |
| Application Example 3 | Example 10 | −750 | 3.0 | 2.0 | 21 | −750 | 3.0 | 2.0 | 22 | S-shape | No defects |
| Comparative Application Example 3 | — | −750 | 4.2 | 2.0 | 33 | −740 | 4.2 | 2.0 | 41 | J-shape | Frequent occurrence of black micro-spots |
| Application Example 4 | Example 8 | −750 | 3.0 | 2.0 | 24 | −742 | 3.1 | 2.0 | 25 | — | No defects |
| Comparative Application Example 4 | — | −750 | 4.5 | 2.0 | 30 | −675 | 5.5 | 2.2 | 42 | — | Frequent occurrence of black micro-spots |

As is apparent from the above Tables 3 and 4, the electrophotographic photoreceptor obtained by using a charge transporting material containing the charge transporting fine particles of the present invention was excellent in both initial characteristics and maintained characteristics, and no defects were observed in the picture quality obtained after copying 20000 times. On the other hand, in comparative application examples in which charge transporting materials not in the form of fine particles were employed, initial characteristics were of a reasonable quality but showed deterioration with the passage of time, and on the pictures obtained after copying 20000 times, black micro-spots were observed to occur frequently.

general formula (4):

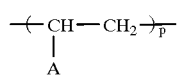

general formula (5):

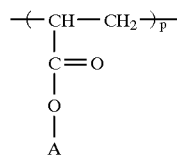

general formula (6):

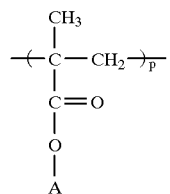

wherein A and B each represents a monovalent or divalent aliphatic hydrocarbon or aromatic hydrocarbon group which may be substituted and at the same time, at least one of A and B is a group represented by any one of the general formulas (7) to (15) and p represents an integer of 5 to 5000;

general formula (7):

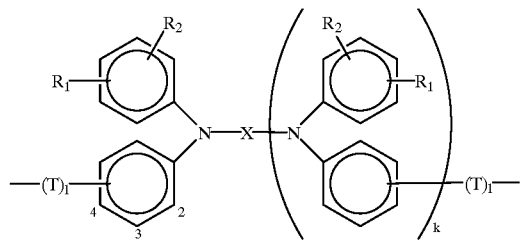

general formula (8):

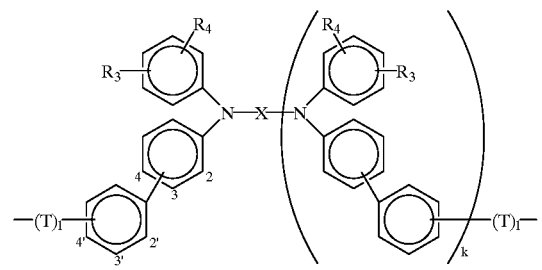

wherein $R_1$ to $R_4$ described in the formulas (7) and (8) each independently represents a hydrogen atom, an alkyl group, an alkoxy group, a substituted amino group, a halogen atom, or a substituted or unsubstituted aryl group; X represents a substituted or unsubstituted divalent aryl group; k and l each independently represents an integer selected from 0 or 1; and T represents a divalent $C_{1-10}$ alkyl group, allyl group, alkylcarbonyl group, allylcarbonyl group, alkylamino group, allylamino group, a hydroxyalkyl group, or hydroxyallyl group which may be branched;

general formula (9):

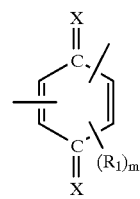

wherein X represents an oxygen atom, $C(CN)_2$, $C(CN)(CO_2R_3)$, or $C(CO_2R_3)(CO_2R_4)$, wherein $R_3$ and $R_4$ each independently represents an alkyl or aryl group; $R_1$ represents an alkyl group, an aryl group, a halogen atom, a nitro group, an acyl group, or a cyano group; and m represents an integer of from 0 to 2;

general formula (10):

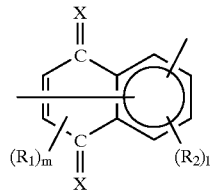

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (11):

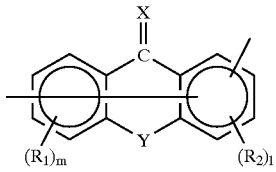

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (12):

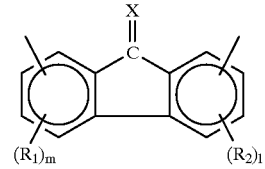

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (13):

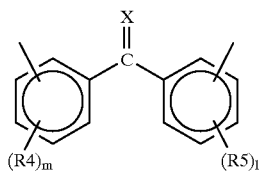

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; R, and $R_2$ each independently represents an alkyl group, an aryl group, a halogen atom, a nitro group, an acyl group, or a cyano group; and m and l each independently represents an integer of from 0 to 2;

general formula (14):

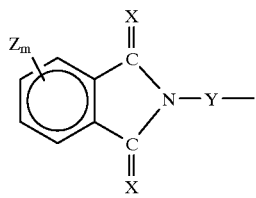

wherein X represents an oxygen atom or $C(CN)_2$; Y represents —COO—$(CH_2)_n$ or

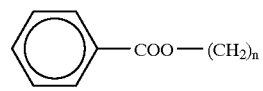

wherein n represents an integer from 1 to 6; Z represents an alkyl group, a halogen atom, a nitro group, an acyl group, or a cyano group; and m represents an integer of from 0 to 2;

general formula (15):

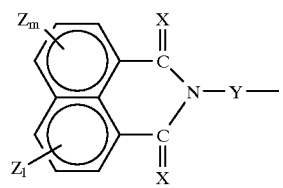

wherein X represents an oxygen atom or $C(CN)_2$; Y represents —COO—$(CH_2)_n$ or, wherein n represents an integer from 1 to 6; Z represents an alkyl group, a halogen atom, a nitro group, an acyl group, or a cyano group; and m and l each independently represents an integer of from 0 to 2.

2. A charge transporting material according to claim 1, wherein said charge transporting fine particles have an average particle size of 0.01 to 50 μm and exhibit particle size distribution ranging from 1.0 to 2.0 as calculated from the square root of the ratio of 90% average particle size to 10% average particle size of the total volume of the fine particles or the square root of the ratio of 90% average particle size to 10% average particle size of the total number of the fine particles.

3. A charge transporting material according to claim 1, wherein at least a portion of the surface of said charge transporting fine particles is covered with a second compound which may react with said charge transporting compound.

4. A charge transporting material according to claim 3, wherein said second compound which may react with said charge transporting compound is selected from the group consisting of silyl isocyanate compounds, polyvalent isocyanate compounds, silane coupling agents and titanate coupling agents.

5. A charge transporting material according to claim 3, wherein said second compound which may react with said charge transporting compound comprises an amine-based charge transporting compound.

6. A charge transporting material comprising charge transporting fine particles formed with a charge transporting organic compound as an essential component, wherein said charge transporting organic compound is at least one compound selected from a high-molecular compounds and low-molecular compounds, each having a positive hole transporting property or electron transporting property, wherein at least a portion of the surface of said charge transporting fine particles is covered with a second compound which may react with said charge transporting compound, and wherein said second compound which may react with said charge transporting compound is selected from the group consisting of silyl isocyanate compounds, polyvalent isocyanate compounds, silane coupling agents, and titanate coupling agents.

7. A charge transporting material comprising charge transporting fine particles formed with a charge transporting organic compound as an essential component, wherein said charge transporting organic compound is at least one compound selected from a high-molecular compounds and low-molecular compounds, each having a positive hole transporting property or electron transporting property, wherein at least a portion of the surface of said charge transporting fine particles is covered with a second compound which may react with said charge transporting compound, and wherein said second compound which may react with said charge transporting compound contains an amine based charge transporting compound.

8. A process for the preparation of charge transporting fine particles, which comprises dissolving or dispersing a charge transporting compound and a second compound which may react with said charge transporting compound in a first medium which can dissolve or disperse said compound therein, dissolving or dispersing the resultant solution or dispersion in a second medium different from said first medium and removing said first medium and/or second medium, thereby granulating to obtain charge transporting fine particles having at least a portion of the surface covered with a second compound which may react with said charge transporting compound wherein said second compound which may react with said charge transporting compound is selected from the group consisting of silyl isocyanate compounds, polyvalent isocyanate compounds, silane coupling agents, and titanate coupling agents.

9. A process for the preparation of charge transporting fine particles according to claim 8, wherein a third compound which may react with said second compound which may react with said charge transporting compound is contained in said second medium.

10. A process for the preparation of charge transporting fine particles according to claim 8, wherein said charge transporting fine particles obtained by granulation are insoluble in said second medium.

11. A process for the preparation of charge transporting fine particles, which comprises dissolving or dispersing a charge transporting compound in a first medium which can dissolve or disperse said compound therein, dissolving or dispersing the resultant solution or dispersion in a second medium different from said first medium, and removing said first medium and/or second medium, thereby carrying out granulation, wherein said charge transporting compound is a high-molecular compound represented by any one of the following general formulas (1) to (6):

general formula (1):

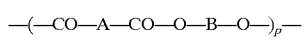

general formula (2):

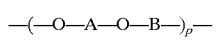

general formula (3):

general formula (4):

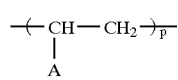

general formula (5):

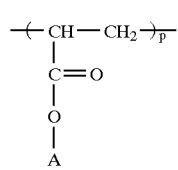

general formula (6):

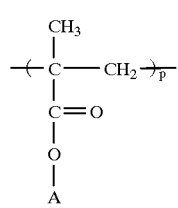

wherein A and B each represents a monovalent or divalent aliphatic hydrocarbon or aromatic hydrocarbon group which may be substituted and at the same time, at least one of A and B is a group represented by any one of the general formulas (7) to (15) and p represents an integer of 5 to 5000;

general formula (7):

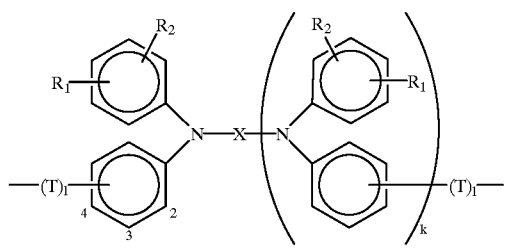

general formula (8):

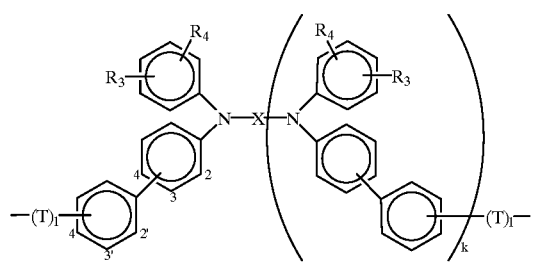

wherein $R_1$ to $R_4$ described in the formulas (7) and (8) each independently represents a hydrogen atom, an alkyl group, an alkoxy group, a substituted amino group, a halogen atom, or a substituted or unsubstituted aryl group; X represents a substituted or unsubstituted divalent aryl group; k and l each independently represents an integer selected from 0 or 1; and T represents a divalent $C_{1-10}$ alkyl group, allyl group, alkylcarbonyl group, allylcarbonyl group, alkylamino group, allylamino group, a hydroxyalkyl group, or hydroxyallyl group which may be branched;

general formula (9):

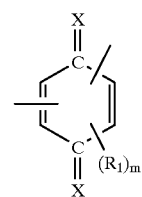

wherein X represents an oxygen atom, $C(CN)_2$, $C(CN)(CO_2R_3)$, or $C(CO_2R_3)(CO_2R_4)$, wherein $R_3$ and $R_4$ each independently represents an alkyl or aryl group; $R_1$ represents an alkyl group, an aryl group, a halogen atom, a nitro group, an acyl group, or a cyano group; and m represents an integer of from 0 to 2;

general formula (10):

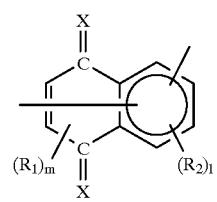

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group, $R_1$ and $R_2$ each independently represents an alkyl group, an aryl group, a halogen atom, a nitro group, an acyl group, or a cyano group; and m and l each independently represents an integer of from 0 to 2;

general formula (11):

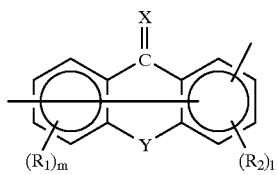

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (12):

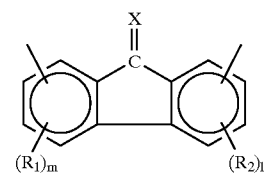

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (13):

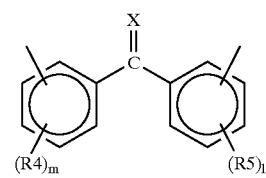

wherein X represents an oxygen atom, $C(CN)_2$, $C(CN)(CO_2R_3)$, or $C(CO_2R_3)(CO_2R_4)$, wherein $R_2$ and $R_3$ each independently represents an alkyl or aryl group; $R_1$ and $R_2$ each independently represents an alkyl group, an aryl group, a halogen atom, a nitro group, an acyl group, or a cyano group; and m and l each independently represents an integer of from 0 to 2;

general formula (14):

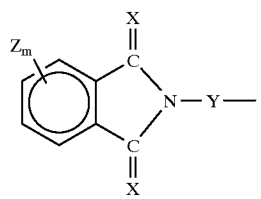

wherein X represents an oxygen atom or $C(CN)_2$; Y represents $-COO-(CH_2)_n$ or

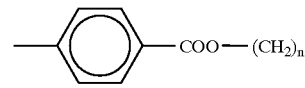

wherein n represents an integer from 1 to 6; Z represents an alkyl group, a halogen atom, a nitro group, an acyl group, or a cyano group; and m represents an integer of from 0 to 2;

general formula (15):

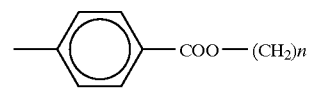

wherein X represents an oxygen atom or $C(CN)_2$; Y represents $-COO-(CH_2)_n$ or, wherein n represents an integer from 1 to 6; Z represents an alkyl group, a halogen atom, a nitro group, an acyl group, or a cyano group; and m and l each independently represents an integer of from 0 to 2.

12. A process for the preparation of charge transporting fine particles, which comprises dissolving or dispersing a charge transporting compound and a second compound which may react with said charge transporting compound in a first medium which can dissolve or disperse said compound therein, dissolving or dispersing the resultant solution or dispersion in a second medium different from said first medium and removing said first medium and/or second medium, thereby granulating to obtain charge transporting fine particles having at least a portion of the surface covered with a second compound which may react with said charge transporting compound,
wherein said second compound which may react with said charge transporting compound comprises an amine-based charge transporting compound.

13. A process for the preparation of charge transporting fine particles according to claim to 12, wherein said charge transporting fine particles obtained by granulation are insoluble in said second medium.

14. The process for the preparation of charge transporting fine particles according to claim 12, further comprising adding to said first medium a third compound which may react with said second compound, wherein said third compound is selected from the group consisting of polyols, polyamines and mixtures thereof.

15. A charge transporting material according to claim 1, said charge transporting fine particles are resin fine particles.

16. A charge transporting material according to claim 1, wherein said charge transporting fine particles are resin fine particles having a charge transporting molecular structure inside of the polymer chain.

* * * * *